United States Patent
Tsuji et al.

(10) Patent No.: US 9,549,483 B2
(45) Date of Patent: Jan. 17, 2017

(54) ENGINE CONTROL UNIT

(71) Applicant: MIKUNI CORPORATION, Tokyo (JP)

(72) Inventors: Ichiro Tsuji, Odawara (JP); Ryuichi Yamazaki, Odawara (JP); Yoshitaka Koga, Odawara (JP)

(73) Assignee: MIKUNI CORPORATION, Tokyo (JP)

( * ) Notice: Subject to any disclaimer, the term of this patent is extended or adjusted under 35 U.S.C. 154(b) by 133 days.

(21) Appl. No.: 14/554,735

(22) Filed: Nov. 26, 2014

(65) Prior Publication Data

US 2015/0116955 A1   Apr. 30, 2015

Related U.S. Application Data

(63) Continuation of application No. PCT/JP2013/064696, filed on May 28, 2013.

(30) Foreign Application Priority Data

May 31, 2012 (JP) ................. 2012-125515

(51) Int. Cl.
*H05K 5/00* (2006.01)
*H05K 7/00* (2006.01)
(Continued)

(52) U.S. Cl.
CPC .............. *H05K 7/1429* (2013.01); *F02P 5/045* (2013.01); *H05K 1/11* (2013.01); *H05K 1/181* (2013.01);
(Continued)

(58) Field of Classification Search
CPC .. H05K 7/1429; H05K 7/1432; H05K 7/1422; H05K 7/02; H05K 7/005; H05K 7/00
(Continued)

(56) References Cited

U.S. PATENT DOCUMENTS 6,233,153 B1 * 5/2001 Baur ............... H05K 5/006
361/752
6,301,104 B1 * 10/2001 Hu .................. G06F 13/409
361/679.02

(Continued)

FOREIGN PATENT DOCUMENTS

JP  5-206419      8/1993
JP  2000-183541   6/2000
(Continued)

OTHER PUBLICATIONS

International Search Report mailed Aug. 13, 2013, in corresponding International Application No. PCT/JP2013/064696.

*Primary Examiner* — Anthony Haughton

(57) ABSTRACT

An engine control unit including a substantially rectangular printed circuit board in which a microcontroller is mounted. The printed circuit board includes a connector portion in which connection terminals are provided to be arranged in one side edge portion along the longitudinal direction thereof. The connection terminals of the connector portion include connection terminals for input on one side in the longitudinal direction and connection terminals for output on the other side with respect to a setting position. A microcontroller is disposed at substantially the center portion of the printed circuit board in the longitudinal direction thereof. An electronic component as an input interface circuit is disposed on the one side in the longitudinal direction, and an electronic component as an output interface circuit is disposed on the other side.

7 Claims, 7 Drawing Sheets

(51) Int. Cl.
*H05K 7/14* (2006.01)
*H05K 1/18* (2006.01)
*F02P 5/04* (2006.01)
*H05K 1/11* (2006.01)
*H05K 3/28* (2006.01)
*F02D 41/28* (2006.01)

(52) U.S. Cl.
CPC .......... *H05K 5/0069* (2013.01); *H05K 7/1452* (2013.01); *F02D 41/28* (2013.01); *F02D 2400/22* (2013.01); *H05K 1/117* (2013.01); *H05K 3/284* (2013.01); *H05K 2201/09172* (2013.01); *H05K 2201/09972* (2013.01); *H05K 2201/10886* (2013.01); *H05K 2203/1316* (2013.01); *Y02P 70/611* (2015.11)

(58) Field of Classification Search
USPC .................................. 361/752–759, 746, 750
See application file for complete search history.

(56) References Cited

U.S. PATENT DOCUMENTS

| | | | | |
|---|---|---|---|---|
| 7,254,038 | B2* | 8/2007 | Drako | ..................... G06F 1/185 361/752 |
| 8,423,695 | B2* | 4/2013 | Purwin | .................. H05K 1/117 361/785 |
| 2002/0162829 | A1* | 11/2002 | Weber | .................. H05B 1/0294 219/209 |
| 2004/0105240 | A1* | 6/2004 | Haba | ..................... G06F 13/409 361/752 |
| 2013/0073768 | A1* | 3/2013 | Cong | .................... G06F 13/409 710/301 |
| 2013/0170128 | A1* | 7/2013 | Liu | ........................... G06F 1/26 361/679.32 |

FOREIGN PATENT DOCUMENTS

JP     2001-25165     1/2001
JP     2008-202484     9/2008

* cited by examiner

ENGINE CONTROL UNIT

CROSS-REFERENCE TO RELATED APPLICATION(S)

This application is a continuation application, filed under 35 U.S.C. §111(a), of International Application PCT/JP2013/064696, filed on May 28, 2013, which claims the foreign priority benefit of Japanese Patent Application No. 2012-125515, filed May 31, 2012, the disclosures of which are incorporated herein by reference.

BACKGROUND

1. Field

Embodiments of the present invention relate to an engine control unit which includes a printed circuit board with a microcontroller mounted thereon and can be used in a vehicle such as a motorcycle or various general-purpose machines having an engine.

2. Description of Related Art

In a fuel injection (FI) system of a vehicle, an engine control unit (ECU) is used to control a fuel injection system. Recently, the ECU is also used in a motorcycle (for example, a motorbike and a motorized bicycle), and the ECU is also used in a smaller motorcycle. In addition, the ECU controls, for example, a fuel injection timing and a fuel injection amount in a fuel injection device as control of the fuel injection system, and controls an ignition timing of an ignition mechanism (spark plug) and an idle rotation speed (idle speed control). Moreover, there may be cases where, in addition to the control of the fuel system including fuel injection and the control of the ignition mechanism, for example, control of an intake and exhaust air system, a valve train mechanism, and start control, and others is performed depending on the type of a vehicle including a four-wheeled vehicle.

The ECU that performs the control described above includes a printed circuit board in which a microcontroller is mounted and one side edge portion includes a male type connector portion having a plurality of connection terminals, and a case which covers and accommodates a part of the printed circuit board excluding the connector portion (for example, refer to Patent Literature 1).

The connector portion of the printed board of the ECU is connected to a female type connector on a vehicle side. To the connector on the vehicle side, wires from various sensors provided in the vehicle to output signals or devices (controlled devices) of the vehicle which are controlled are collectively connected.

PATENT LITERATURE

Patent Literature 1: Japanese Publication No. 8-316650 A

SUMMARY

However, in the ECU mounted in the vehicle, particularly, in the ECU mounted in the motorcycle, there are problems of infiltration of rainwater, vibration or impact during travel, chemicals that may be brought into contact during travel and the like, heat from the ECU, various noises, and the like. In addition, regarding the motorcycle, as the vehicle is reduced in size, a mounting space of the ECU is more restricted, and thus a reduction in the size of the ECU is required. In addition, a part to which low voltage signals are input from various sensors and a part which outputs relatively high current to control the controlled devices are mixed in the ECU, and thus there is a problem in that heat or noise generated in the part in which high current flows adversely affects the part to which the low voltage signals are input.

Embodiments of the present invention have been made taking the forgoing circumstances into consideration, and an object thereof is to provide an engine control unit capable of inhibiting the occurrence of problems caused by water, chemicals, vibration, heat, noise, and the like.

In order to achieve the object, an engine control unit includes:

a substantially rectangular printed circuit board in which a microcontroller is mounted, wherein one side edge portion of the printed circuit board along a longitudinal direction of the printed circuit board is a connector portion having a plurality of connection terminals which are provided on at least one surface side of the side edge portion to be arranged along the longitudinal direction, in the connector portion, the connection terminals for signal input are provided on one side in the longitudinal direction, and the connection terminals for control output are provided on the other side in the longitudinal direction, with respect to a position set in the longitudinal direction, and in the printed circuit board, the microcontroller is provided at substantially the center portion in the longitudinal direction, an input interface component which is connected to the connection terminals for signal input and is connected to the microcontroller is provided on the one side in the longitudinal direction, and an output interface component which is connected to the connection terminals for control output and is connected to the microcontroller is provided on the other side in the longitudinal direction, with respect to substantially the center portion of the printed circuit board in the longitudinal direction.

In this configuration, for example, in the printed circuit board of the ECU, for example, one side edge portion along the longitudinal direction includes the connector portion in which the plurality of connection terminals are arranged along the longitudinal direction. In this case, in the rectangular printed circuit board, for example, the length of the printed circuit board along the connector portion connected to a connector device of an apparatus side having an engine such as a vehicle (engine apparatus side connector device) is longer than the depth of the printed circuit board which is perpendicular thereto.

Therefore, the width of a part of the printed circuit board which is connected to the engine apparatus side connector device is longer than the depth of the printed circuit board, and the printed circuit board is connected to the engine apparatus side connector device over a long distance, thereby achieving a structure robust against vibration. That is, since the width of the connection part (connector portion) which supports the printed circuit board is long and the distance (depth) of the printed circuit board in a direction further away from the above-described connection part is short, the strength of the connection part for supporting the printed circuit board (ECU) can be increased, and stress applied to the above-described connection part due to shaking of the ECU at the time of receiving vibration or impact can be reduced. In addition, a main component of the ECU is the printed circuit board, and the longitudinal and transverse lengths thereof are almost determined by the longitudinal and transverse lengths of the printed circuit board.

In addition, since the connector portion of the printed circuit board is provided in the side edge portion of the printed circuit board along the longitudinal direction, compared to a case where the connector portion is provided in the side edge portion on the short side, a number of connection terminals can be provided. Accordingly, a shortage of the connection terminals can be prevented. The remaining connection terminals may be used as spare connection terminals, and in a case where a plurality of types of ECUs are provided or in a case where the ECU is improved to be newly manufactured, even when the connector portion having a larger number of connection terminals than that in a current status is needed, the connector portion having the form in the current status can correspond thereto as it is. That is, when an ECU at a higher grade than that of the current status is manufactured or an improved ECU is manufactured, even when the number of necessary connection terminals is increased, the form of the connector portion is not changed. Accordingly, the form of the connector on the engine apparatus side connector device side may not be changed even when the ECU is renewed.

In addition, in the connector portion, as described above, the connection terminals for signal input are disposed on one side of a setting position, and the connection terminals for control output are disposed on the other side. In addition, the microcontroller which inputs and outputs signals is disposed at substantially the center portion of the printed circuit board in the longitudinal direction, the input interface component which inputs a signal input from a sensor or the like to the microcontroller is disposed on one side of the printed circuit board in the longitudinal direction, and the output interface component which supplies a control signal (and power) to a controlled device is disposed on the other side of the printed circuit board in the longitudinal direction.

Accordingly, in the printed circuit board, a wiring pattern which connects the connection terminals for signal input, the input interface component, and the microcontroller is disposed closer to one side than substantially the center portion in the longitudinal direction. In addition, in the printed circuit board, a wiring pattern which connects the connection terminals for control output, the output interface component, and the microcontroller is disposed closer to the other side than substantially the center portion in the longitudinal direction.

As described above, since the electronic components, the connection terminals, the wiring patterns are separated into the input side and the output side with respect to the microcontroller which inputs and outputs signals, the space efficiency of the arrangement of the electronic components and the wiring patterns can be optimized, thereby achieving a reduction in the area of the printed circuit board. Accordingly, a reduction in the size of the ECU can be achieved.

In addition, on the output side, relatively high power is supplied to the controlled component, and thus there is a situation in which heat or noise is easily generated. However, since the electronic component and the wiring pattern on the input side and the electronic component and the wiring pattern on the output side are separately arranged, a structure in which the electronic component and the wiring pattern on the input side are not easily affected by heat or noise from the output side can be achieved.

In addition, as described above, since the space efficiency of the wiring pattern is enhanced, the distance between the wires in the wiring pattern is shortened, and thus a structure which is less likely to be affected by noise is achieved.

In the configuration, it may be preferable that a part of the printed circuit board excluding the connector portion be covered and sealed with a transfer-molded resin.

In this configuration, since the part of the printed circuit board excluding the connector portion is sealed with the mold resin which is transfer-molded, water resistance and chemical resistance are excellent. In addition, since the electronic components are covered with the mold resin, there is a concern that heat may be easily trapped. However, as described above, since the electronic component and the wiring pattern on the input side and the electronic component and the wiring pattern on the output side are separately arranged, the electronic component associated with signal input on the input side can be inhibited from being affected by heat.

In addition, the mold resin has relatively high elasticity and shrinks at a relatively high shrinkage during molding, resulting in the occurrence of strain. Therefore, stress occurs after the molding. Accordingly, when the volume of the mold resin part is large, there is a concern that warpage may occur after the molding. Here, it may be preferable that the area of the printed circuit board be small in order to reduce the size of the mold resin, and it may be preferable that the size of the mold resin be reduced by providing the above-described arrangement with a high space efficiency and reducing the area of the printed circuit board, thereby inhibiting the occurrence of warpage.

In addition, in the configuration, it may be preferable that the printed circuit board have four or more layers, and the layer provided with a ground for low power to which the input interface component is connected and the layer provided with a ground for high power to which the output interface component is connected be separately provided.

According to this configuration, in the board having four or more layers, since the layer provided with the ground for low power to which the input interface component is connected and the layer provided with the ground for high power to which the output interface component is connected are separately provided, the input side can be prevented from being affected by heat or noise on the output side.

According to the embodiments of the present invention, the ECU may have a structure robust against vibration or impact during travel. In addition, since the electronic component on the output side on which high current may flow and the electronic component on the input side are separately provided, the space efficiency of the electronic component and the wiring pattern can be improved, and the electronic component on the input side can be prevented from being affected by heat or noise generated by the electronic component and the like on the output side.

BRIEF DESCRIPTION OF DRAWINGS

These and/or other aspects and advantages will become apparent and more readily appreciated from the following description of the embodiments, taken in conjunction with the accompanying drawings of which.

DESCRIPTION OF EMBODIMENTS

Hereinafter, embodiments will be described with reference to the drawings.

An ECU is used, for example, in a motorcycle as a vehicle, and is an ECU which controls a fuel injection timing and a fuel injection amount of a fuel injection device in a FI system, an idle rotation speed (an idle speed control valve), and an ignition timing of an ignition mechanism. To the ECU, for example, controlled devices such as the fuel injection device, a fuel pump, a driving device of the idle speed control valve, a driving circuit of an ignition coil, and the like are connected. For the control, for example, sensors such as a crank angle sensor, an intake air temperature sensor, an intake air pressure sensor, an engine temperature sensor, a throttle sensor, and the like are connected thereto.

Figure 1:
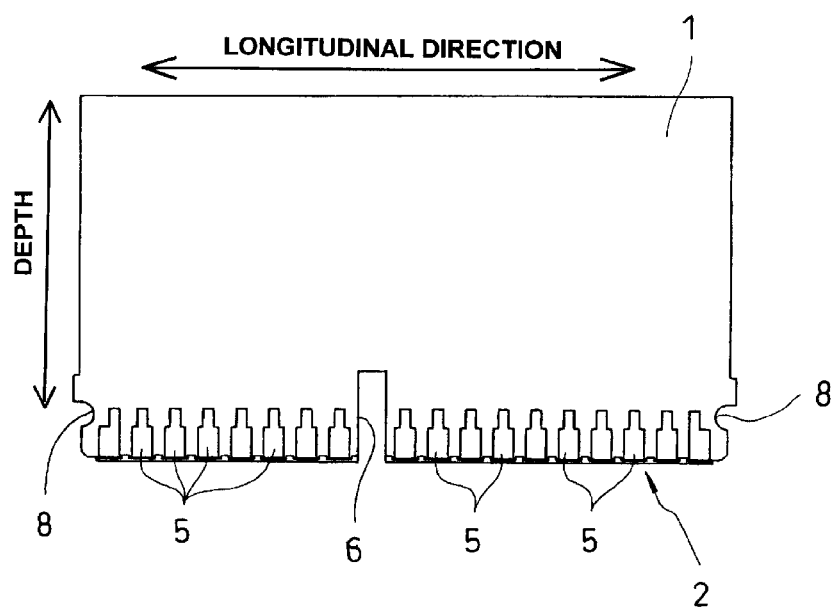
FIG. 1 is a plan view illustrating a printed circuit board of an ECU of an embodiment.
Figure 2:
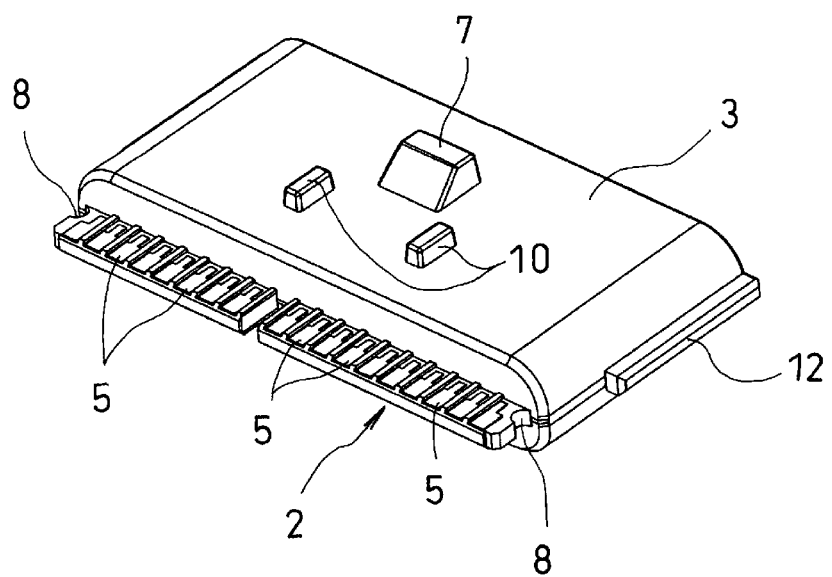
FIG. 2 is a perspective view illustrating the ECU.
Figure 3:
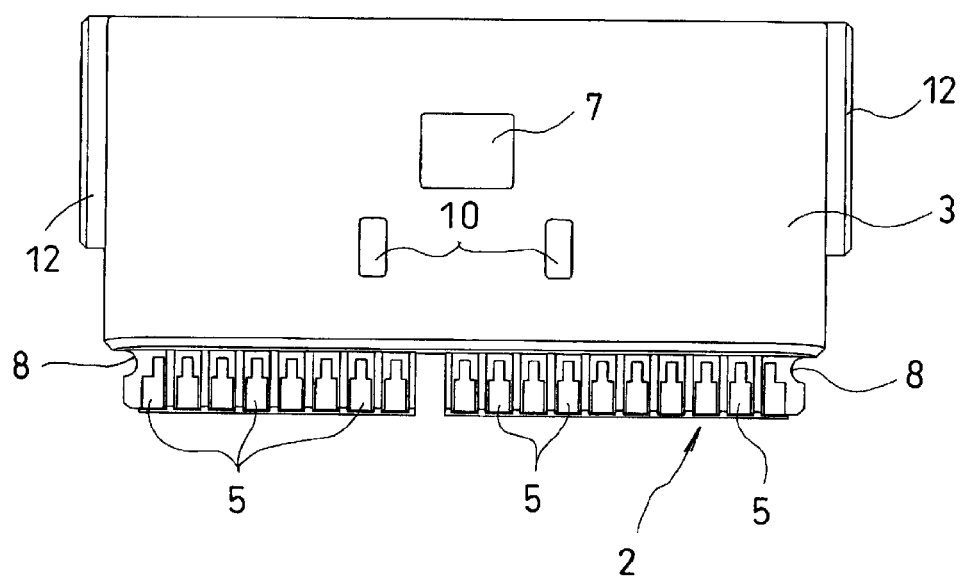
FIG. 3 is a top view illustrating the ECU.
Figure 4:
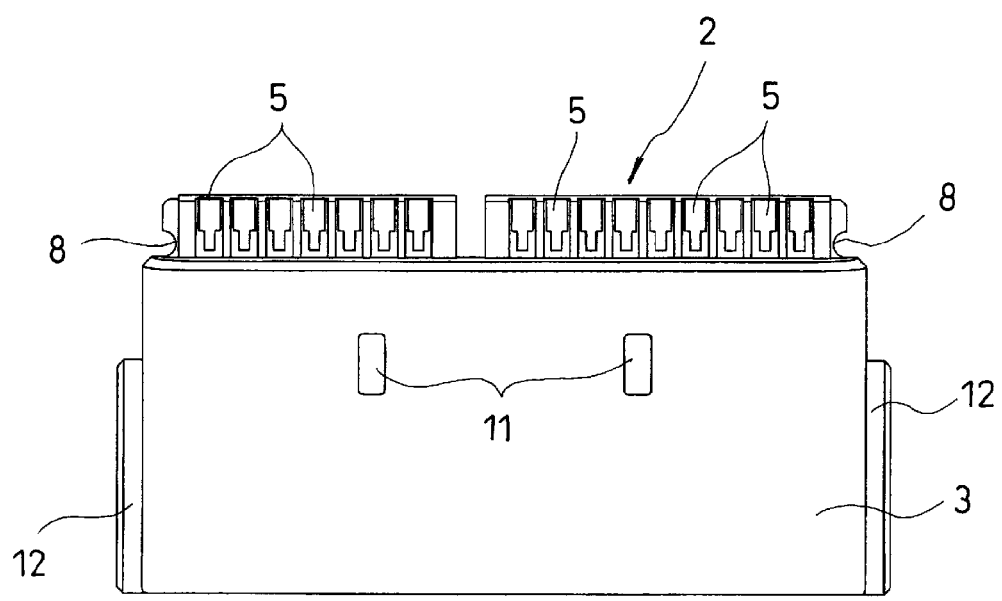
FIG. 4 is a bottom view illustrating the ECU.
Figure 5:
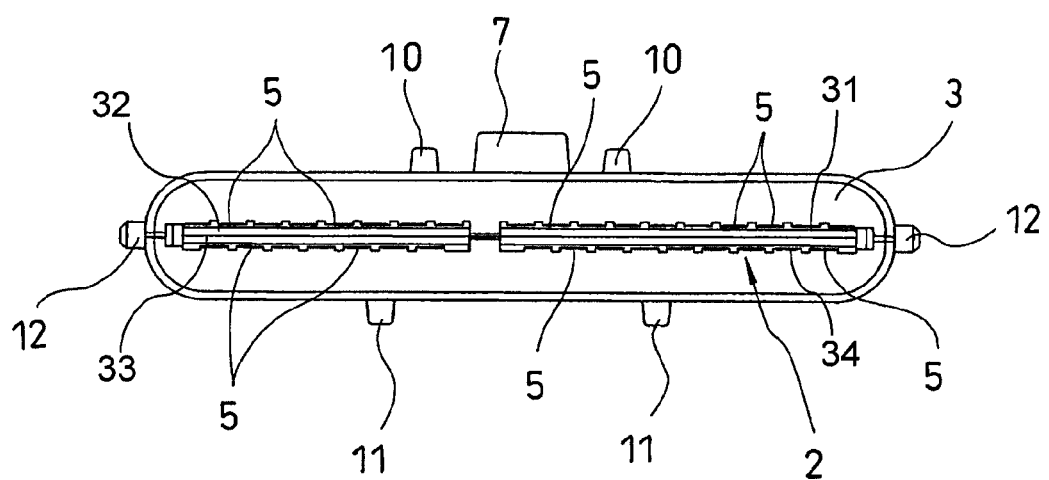
FIG. 5 is a front view illustrating the ECU.
Figure 6:
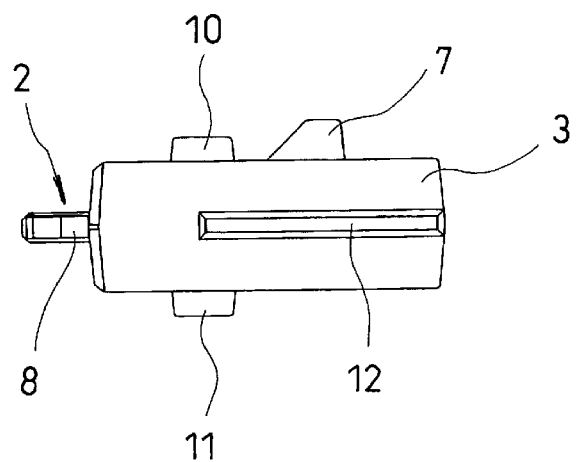
FIG. 6 is a side view illustrating the ECU.

The ECU includes a printed circuit board 1 illustrated in FIG. 1, and as illustrated in FIGS. 2 to 6, in the printed circuit board 1, a mold resin 3 which covers and seals a part excluding a connector portion 2, which will be described later, is provided by transfer molding. In addition, although not illustrated in FIG. 1, the printed circuit board 1 has two side surfaces, and a circuit pattern is formed and electronic components are mounted on each side surface. Here, one side surface of the printed circuit board 1 is referred to as a front surface, and the other side surface is referred to as a rear surface. In addition, the front surface and the rear surface may be interchanged.

The printed circuit board 1 which is a four-layer board includes, for example, two layers which are two exposed side surfaces and two inside layers. A wiring pattern is provided and the electronic components are mounted on the two exposed layers. The two inside layers are layers each of which includes a pattern for a power source and for the ground.

The printed circuit board 1 has a substantially rectangular shape in which the long side is, for example, 1.1 or more times the short side. In this embodiment, the ratio therebetween is about 1.8 (about 1.6 to 2) and may also be higher.

One side edge portion (the side edge portion on the long side) of the substantially rectangular printed circuit board 1 along the longitudinal direction serves as the connector portion 2. On both sides of the connector portion 2, a plurality of connection terminals 5 are provided to be arranged along the longitudinal direction of the printed circuit board 1 at equal intervals. In addition, semicircular cutout portions 8 are provided on the right and the left of the connector portion 2 of the printed circuit board 1, and a section from the cutout portions 8 to the side edge of the printed circuit board 1 on the connector portion 2 side serves as the connector portion 2 and is exposed from the mold resin 3.

In addition, in the connector portion 2, at a position slightly shifted from the center in the vicinity of the center portion of the printed circuit board 1 in the longitudinal direction, a slit 6 which is open toward the side edge of the connector portion 2 and is long along a direction perpendicular to the longitudinal direction of the printed circuit board 1 is provided. The width of the slit 6 along the longitudinal direction is a length in which the single connection terminal 5 can be disposed. Since the slit 6 is present, the connection terminal 5 is not disposed, and the interval between the connection terminals 5 disposed with the slit 6 interposed therebetween is longer than the other parts. The connector portion 2 is a plate-like member as a part of the printed circuit board 1, and the connection terminals 5 which are respectively provided on both surfaces (front and rear surfaces) of the connector portion 2 are, for example, made of metal such as plated copper and are fixed to the front and rear surfaces of the connector portion 2.

In order to distinguish the front and rear surfaces of the printed circuit board 1 from each other at the time of molding the mold resin 3 to the printed circuit board 1 or at the time of connecting the connector portion 2 of the printed circuit board 1 to a vehicle side connector, the slit 6 is offset to a position which is slightly shifted from the center of the connector portion 2 in the longitudinal direction of the printed circuit board 1.

Parts excluding the connector portion 2 are covered with the mold resin 3 as illustrated in FIGS. 2 to 6. The inside of the mold resin 3 is molded basically with no void if possible, that is, is molded to be solid. The mold resin 3 is formed to cover the front and rear surfaces of the parts of the printed circuit board 1 excluding the connector portion 2 and the three side edge portions excluding the connector portion 2.

The mold resin 3 is molded into a thick plate shape and into a shape in which the side surfaces of the side edge portions on the short sides of the printed circuit board are curved in a substantially semicylindrical shape. Therefore, when the mold resin 3 is viewed from the front surface side on which the connector portion 2 of the printed circuit board 1 is exposed, the side surfaces on the right and the left have semicircular shapes.

In addition, the printed circuit board is disposed at a position which is substantially the half of the thickness of the mold resin 3.

On the front surface (upper surface) of the mold resin 3, the vehicle side connector (not illustrated) to which the connector portion 2 of the ECU is connected is provided, and a locking convex portion 7 which is locked to a locking hole of a cylindrical cover that covers the outer circumference of the mold resin 3 of the ECU is provided. Accordingly, the connector portion 2 of the ECU is not deviated from the vehicle side connector.

In addition, on the right and left side surfaces of the mold resin 3, rib-shaped guide convex portions 12 which are guided by guide portions which are provided in the inner circumferential surface of the cover to guide the insertion of the ECU into the cover are respectively provided. In addition, a pair of convex portions 10 is provided on the front surface of the mold resin 3, a pair of convex portions 11 is provided on the rear surface of the mold resin 3, and the convex portions 11 and 12 are in a state of substantially abutting on the inner circumferential surface of the cover. The movement (shaking) of the ECU in the cover is restricted by the convex portions 10 and 11, the guide convex portions 12, and the locking convex portion 7.

Figure 7:
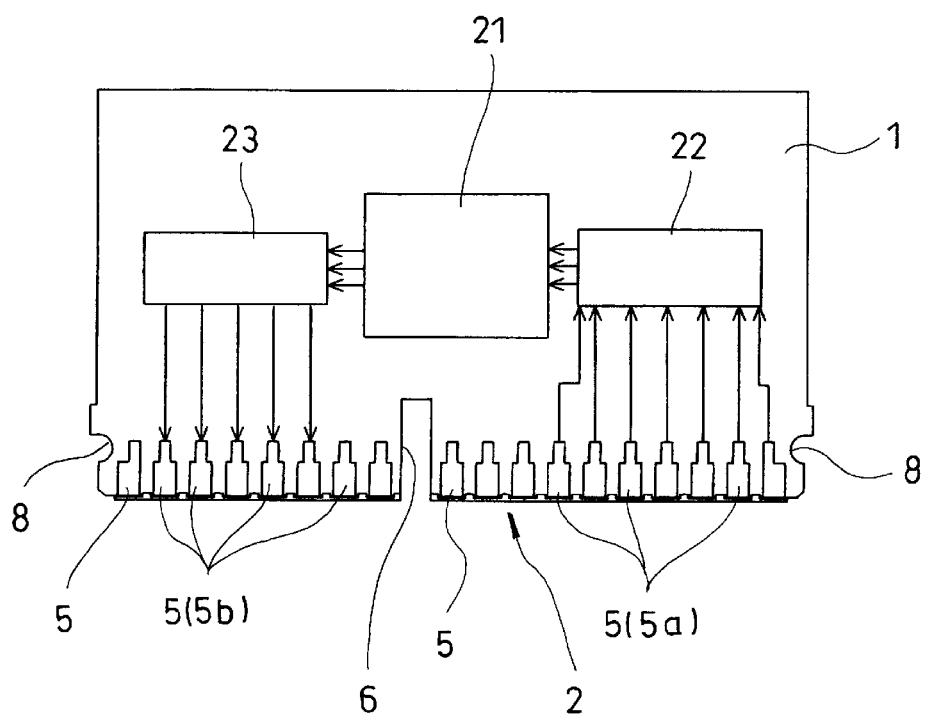
FIG. 7 is a block diagram illustrating the schematic configuration of the printed circuit board.

In the ECU described above, electronic components (not illustrated) are disposed and surface-mounted on the printed circuit board 1 as illustrated in the block diagram of FIG. 7.

On the rectangular printed circuit board 1, as described above, the connector portion 2 having the connection terminals 5 which are provided to be arranged along the longitudinal direction in one side edge portion along the longitudinal direction of the printed circuit board 1 is provided. In the connector portion 2, the connection terminals 5 on one side (the right side in FIG. 7) in the longitudinal direction with respect to the slit 6 disposed at the substantially center portion in the longitudinal direction as a setting position of the printed circuit board 1 in the longitudinal direction are, for example, connection terminals 5a for signal input to which wires from the above-mentioned various sensors are connected and signals from the sensors are input. In addition, in the input connection terminals 5a, spare connection terminals to which no wire is connected are included. There may be cases where the spare connection terminals are used for, for example, a new product in which the specifications of the ECU are changed.

In addition, in the connector portion 2, the connection terminals 5 on the other side (the left side in FIG. 7) in the longitudinal direction with respect to the slit 6 as the setting position of the printed circuit board 1 in the longitudinal direction are, for example, connection terminals 5b for control output for outputting control signals, driving power, or the like as control outputs to the controlled devices controlled by ECU such as the fuel injection device described above. In addition, in the connection terminals 5b for control output, spare connection terminal to which no wire is connected are also included. There may be cases where the spare connection terminals are used for, for example, a new product in which the specifications of the ECU are changed.

In the printed circuit board 1, for example, a well-known microcontroller 21 for controlling the controlled device such as the above-mentioned fuel injection device is provided. The microcontroller 21 is disposed at substantially the center portion of one side surface (for example, the front surface) of the printed circuit board 1 in the longitudinal direction. The microcontroller 21 is, for example, a single-chip microcontroller which includes, for example, a CPU core and a memory such as a ROM, a RAM, or the like.

The signals from the above-mentioned various sensors are input to the microcontroller 21 via the connection terminals 5a for signal input, an input interface component which serves as an input interface circuit 22, and the wiring pattern provided in the printed circuit board 1.

A plurality of electronic components (may also be a single electronic component) which constitute the input interface circuit 22 are disposed closer to one side (the right side in FIG. 7) in the longitudinal direction than substantially the center portion of the printed circuit board 1 in the longitudinal direction. The plurality of electronic components constituting the input interface circuit 22 convert, for example, a signal input from the outside into a form that can be input from the input terminal of the microcontroller 21. The input interface electronic components basically treat a signal having a low voltage of 0.5 V or the like, and thus operate with low power without requiring high current.

From the microcontroller 21 to the above-mentioned various controlled devices, the control signals for controlling the controlled devices or the driving power for driving the controlled devices are output from the connection terminals 5a for control output to the controlled devices via an output interface electronic component which serves as an output interface circuit 23 and the wiring pattern provided in the printed circuit board 1 from the microcontroller 21.

A plurality of electronic components (may also be a single electronic component) which constitute the output interface circuit 23 are disposed closer to the other side (the left side in FIG. 7) in the longitudinal direction than substantially the center portion of the printed circuit board 1 in the longitudinal direction. The electronic components constituting the output interface circuit 23 output the control signals or the driving current corresponding to the controlled devices on the basis of the control signals output from the microcontroller. There is a possibility that the output current may approximately, for example, 2 amps depending on the case.

In the printed circuit board 1 which is the four-layer board, the first layer or inside layer 32 provided with the above-described ground to which the ground terminal of the input interface component as the input interface circuit 22 is connected, and the second layer or inside layer 33 provided with the ground to which the ground terminal of the output interface component as the output interface circuit 23 is connected are different layers from each other.

In the printed circuit board 1, the electronic components can be mounted on both the front surface layer 31 and the rear surface layer 34. For example, the microcontroller 21 is mounted on the front surface layer 31, the input interface component and the output interface component are mounted as described above, and even on the rear surface layer 34, the input interface component and the output interface component are separately disposed on one side and on the other side in the longitudinal direction as described above.

In the ECU described above, a temperature increase due to heat generation and a noise amount on the output interface circuit 23 side which treats relatively high current are greater than those on the input interface circuit 22, and this has a possibility of adversely affecting the input interface side. Contrary to this, in this embodiment, as described above, the region in which the connection terminals 5a on the input side, the wiring pattern on the input side on the board, and the electronic components (the input interface circuit 22) on the input side are disposed and the region in which the connection terminals 5b on the output side, the wiring pattern on the output side on the board, and the electronic components (the output interface circuit 23) on the output side are disposed are separated from each other. Therefore, the input side can be inhibited from being adversely affected by heat or noise on the output side.

In addition, in the rectangular printed circuit board 1, the microcontroller including the input and output terminals is disposed at substantially the center portion in the longitudinal direction thereof, and the wiring pattern, the electronic components on the input side, the connection terminals 5a on the input side which are connected to the input terminal side of the microcontroller 21 and the wiring pattern, the electronic components on the output side, and the connection terminals 5b on the output side which are connected to the output terminal side of the microcontroller 21 are separately disposed on one side and the other side with respect to substantially the center of the printed circuit board 1 in the longitudinal direction. Therefore, these can be efficiently arranged, thus the wires are prevented from being lengthened due to the arrangement of the electronic components, thereby shortening the wires of the wiring pattern.

Accordingly, a reduction in the area of the printed circuit board 1 is achieved, and thus a reduction in the size of the ECU can be achieved. In addition, by shortening the wires of the wiring pattern, resistance to noise can be increased. Moreover, in the printed circuit board 1 which is the four-layer board, since the inside layer provided with the ground to which the ground terminal of the input interface component is connected and the inside layer provided with the ground to which the ground terminal of the output interface component is connected are different layers from each other, the input side can be prevented from being adversely affected by noise or heat on the output side.

Furthermore, since the connector portion 2 is provided in the side edge portion on the long side of the printed circuit board 1 along the longitudinal direction, compared to a case where the connector portion is provided in the side edge portion on the short side, a larger number of connection terminals 5 can be provided. In this case, when the connection terminals remain in the product in a current status, even though the number of connection terminals needed for a newly developed product is increased, the connector portion 2 having the same form as that of the current status can be used. Accordingly, even in the new product in which the number of necessary connection terminals is increased, as the connector portion 2 and the vehicle side connector connected to the connector portion 2, components having the same shapes as those of an old product can be used. Therefore, the connector portion 2 and the connector connected to the connector portion 2 do not need to be newly designed or a part of a manufacturing apparatus does not need to be changed, thereby achieving a reduction in cost.

In addition, although vibration or impact is applied to the ECU during travel of the vehicle, the length of the connector portion 2 connected to the vehicle side connector is longer than the length of the ECU along a direction further away from the connector, and thus a structure which is less likely to be affected by vibration or impact can be achieved. In addition, although the part of the printed circuit board 1 excluding the connector portion 2 is covered with the mold resin and thus the ECU becomes heavy, by shortening the length of the ECU which extends from the connector portion 2 as described above, stress applied to the connection portion between the connector portion 2 and the vehicle side connector is reduced at the time of receiving vibration or impact, and thus the connection portion can be prevented from receiving a high load.

The ECU can be used in engine control of, in addition to the vehicle, for example, various general-purpose machines such as a mower, a chainsaw, an agrochemical sprayer, and a private power generator.

DESCRIPTION OF REFERENCE CHARACTERS 1 printed circuit board
2 connector portion
3 mold resin
5 connection terminal
5a connection terminal for signal input
5b connection terminal for control output
6 slit (setting position)
21 microcontroller
22 input interface circuit (input interface component)
23 output interface circuit (output interface component)

What is claimed is:
1. An engine control unit comprising:
a substantially rectangular printed circuit board, the printed circuit board including a connector portion along one longitudinal side edge portion thereof, the connector portion including a plurality of connection terminals arranged along a longitudinal direction of the one longitudinal side edge portion, the plurality of connection terminals including input connection terminals arranged along a first side of the one longitudinal side edge portion in the longitudinal direction and output connection terminals arranged along a second side of the one longitudinal side edge portion opposite the first side in the longitudinal direction;
a microcontroller mounted on the printed circuit board at substantially a center portion with respect to the longitudinal direction;
an input interface component connected to the input connection terminals and to the microcontroller and mounted on the printed circuit board toward the first side of the one longitudinal side edge portion in the longitudinal direction; and
an output interface component connected to the output connection terminals and to the microcontroller and mounted on the printed circuit board toward the second side of the one longitudinal side edge portion in the longitudinal direction,
wherein the input connection terminals and the output connection terminals are separated from each other along the longitudinal direction of the one longitudinal side edge portion by a slit formed in the one longitudinal side edge portion between the input connection terminals and the output connection terminals, and
the slit is open toward the side edge of the connector portion, the slit being formed at a position shifted from the center in the vicinity of the center portion of the printed circuit board in the longitudinal direction, the slit having an axis in a direction perpendicular to the longitudinal direction of the printed circuit board.

2. The engine control unit according to claim 1, wherein a part of the printed circuit board excluding the connector portion is covered with and sealed with a transfer-molded resin.

3. The engine control unit according to claim 1, wherein the printed circuit board has four or more layers including at least a first layer with a ground for low power to which the input interface component is connected and a second layer provided with a ground for high power to which the output interface component is connected, and
the first layer and the second layer are separate layers.

4. The engine control unit according to claim 2, wherein the printed circuit board has four or more layers including at least a first layer with a ground for low power to which the input interface component is connected and a second layer provided with a ground for high power to which the output interface component is connected, and
the first layer and the second layer are separate layers.

5. A vehicle comprising:
a fuel injection system; and
the engine control unit of claim 1 configured to control the fuel injection system.

6. A vehicle comprising:
an ignition mechanism; and
the engine control unit of claim 1 configured to control the ignition mechanism.

7. A printed circuit board comprising:
a plurality of connection terminals arranged along a longitudinal direction of one longitudinal side edge portion of the printed circuit board, the plurality of connection terminals including input connection terminals arranged along a first end of the one longitudinal side edge portion in the longitudinal direction and output connection terminals arranged along a second end of the one longitudinal side edge portion opposite the first end in the longitudinal direction; and
a slit formed in the one longitudinal side edge portion of the printed circuit board between the input connection terminals and the output connection terminals,
wherein the slit is open toward the side edge of the connector portion, the slit being formed at a position shifted from the center in the vicinity of the center portion of the printed circuit board in the longitudinal direction, the slit having an axis in a direction perpendicular to the longitudinal direction of the printed circuit board.

* * * * *